United States Patent [19]

Munday

[11] Patent Number: 4,654,588

[45] Date of Patent: Mar. 31, 1987

[54] TIME-OF-USE WATT-HOUR METER WITH DEMAND PROFILE CAPABILITY

[75] Inventor: Mark L. Munday, Raleigh, N.C.

[73] Assignee: Westinghouse Electric Corp., Pittsburgh, Pa.

[21] Appl. No.: 657,921

[22] Filed: Oct. 5, 1984

[51] Int. Cl.[4] .......................................... G01R 19/16
[52] U.S. Cl. ................................ 324/103 R; 364/483
[58] Field of Search ...................... 324/103 R, 103 P; 364/481, 483; 340/870.02

[56] References Cited

U.S. PATENT DOCUMENTS

| | | |
|---|---|---|
| 3,878,391 | 4/1975 | McClelland et al. |
| 3,913,014 | 10/1975 | Halstead et al. |
| 4,034,292 | 7/1977 | McClelland . |
| 4,047,024 | 9/1977 | Henderson . |
| 4,077,061 | 2/1978 | Johnston et al. |
| 4,081,746 | 3/1978 | Snyder et al. |
| 4,119,948 | 10/1978 | Ward et al. .................... 340/870.02 |
| 4,298,839 | 11/1981 | Johnston . |
| 4,301,508 | 11/1981 | Anderson et al. ................. 364/483 |
| 4,368,519 | 1/1983 | Kennedy ............................ 364/483 |
| 4,516,213 | 5/1985 | Gidden ........................... 324/103 R |

FOREIGN PATENT DOCUMENTS

| | | | |
|---|---|---|---|
| 2633182 | 1/1978 | Fed. Rep. of Germany ... | 324/103 R |
| 0447504 | 5/1936 | United Kingdom ............ | 324/103 R |
| 1216911 | 4/1970 | U.S.S.R. .......................... | 324/103 R |
| 1807603 | 12/1974 | U.S.S.R. .......................... | 324/103 R |

OTHER PUBLICATIONS

"Type P Demand Indicators", by Fort Wayne Electric Works of GE Company, 2/15, Bulletin 46101, #1152, pp. 1-3.

Primary Examiner—Reinhard J. Eisenzopf
Assistant Examiner—B. Burns
Attorney, Agent, or Firm—B. R. Studebaker

[57] ABSTRACT

A time-of-use watt-hour meter is provided with demand profile capability that defines a plurality of survey periods and demand intervals. During each survey period, electrical consumption is measured during a plurality of demand intervals. The highest measured interval demand occurring during each survey period is saved and compared to the highest interval demands for subsequent survey periods. The five highest interval demands occurring during a billing period are saved for inspection by both the electric utility and the consumer. The use of the survey periods and demand intervals has the beneficial affect of avoiding clusters of peak periods occurring during a single sustained period of high electrical consumption. The results of the demand profile data compilation can be viewed at the watt-hour meter or remotely.

15 Claims, 5 Drawing Figures

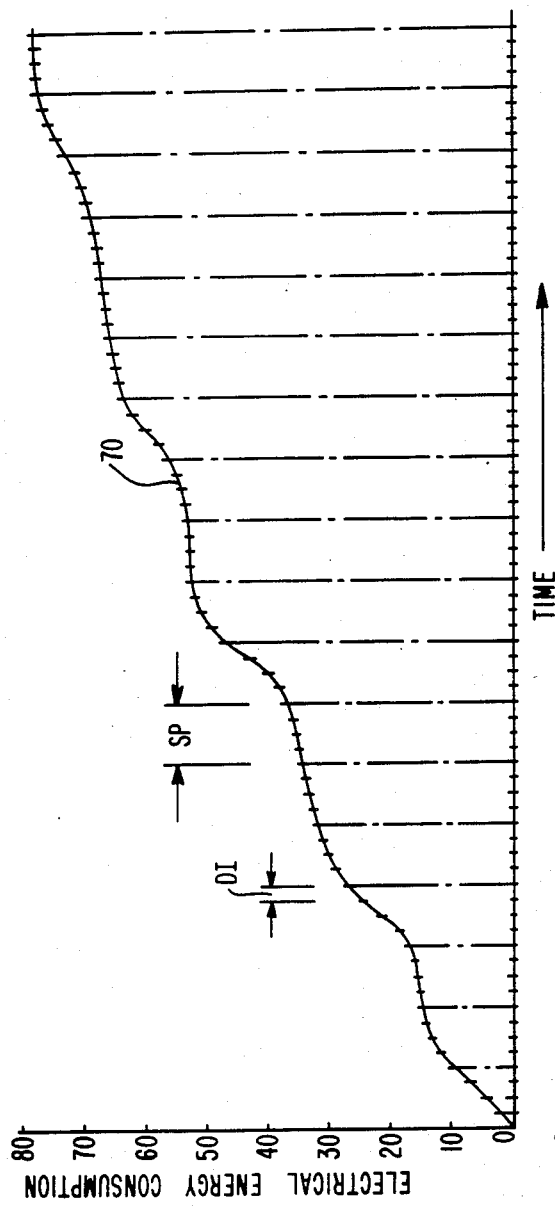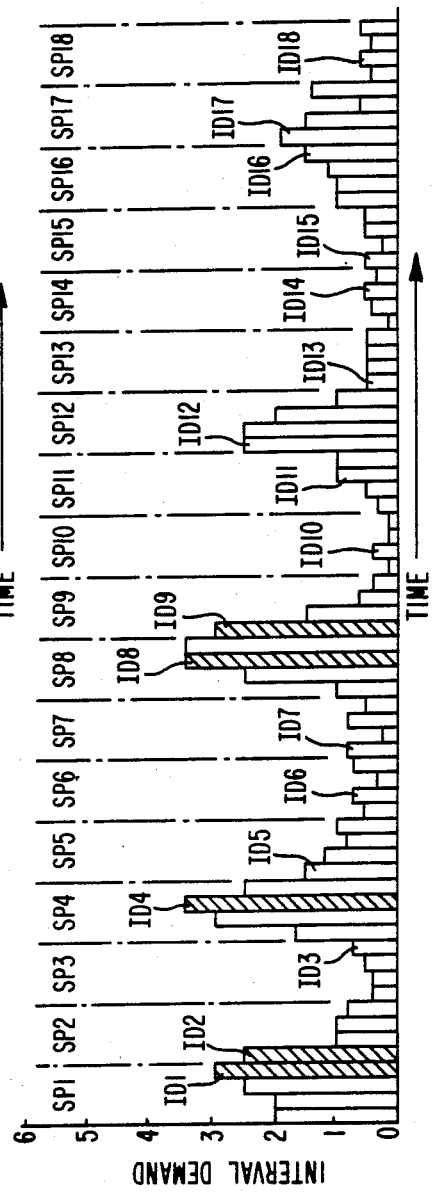

TIME-OF-USE WATT-HOUR METER WITH DEMAND PROFILE CAPABILITY

BACKGROUND AND SUMMARY OF THE INVENTION

The present invention relates generally to time-of-use watt-hour meters and, more particularly, to time-of-use meters that retain a preselected number of energy demand values.

Time-of-use watt-hour meters provide electric utilities and their customers with the capability for utilizing complex rate structures. When time-of-use watt-hour meters are used, different billing rates can be used for different times of the day, days of the week and for other special events, such as holidays and season changes. In order to operate as a time-of-use meter, a watt-hour meter must have the capability for measuring time and maintaining clock and calendar values. The cost of electrical energy consumption can then be determined as a function of the particular time when the electrical energy is consumed.

Demand watt-hour meters serve a slightly different function. They permit electric utilities to determine their customers' bills according to the customer's peak energy demand over a prescribed length of time, such as a billing period. Although each customer's utility bill will vary as a function of the total energy consumed over a prescribed billing period, the electric bill will also be determined as a function of the customer's highest demand for electrical energy during that billing period. The purpose of this type of billing structure is to charge the electrical consumer according to the power capabilities, on the part of the electrical utility, that that consumer necessitates. For example, if a particular electrical consumer experiences short periods of extremely high electrical energy demand during a billing period, the electric utility must provide transformers and associated hardware that is sufficient for the customer's peak energy requirements.

There are various known ways by which an electric utility can measure a consumer's demand for electrical energy. One way is to provide the electrical energy consumer with a recording device that continuously measures and records the level of the consumer's energy consumption. At the end of a prescribed period of time, the electric utility would then read a memory medium, such as a magnetic tape or solid-state memory device, and determine the time and magnitude of that customer's peak demand for electrical energy. Apparatus which provides this type of demand profile for a customer is, by its nature, memory intensive. Time-of-use demand meters, which are typically not of the mass data recording type, are generally limited in capability to storing a single demand value which represents the highest single period of peak energy demand of a particular electric consumer.

More recently, time-of-use watt-hour meters have been designed to incorporate a microprocessor. The incorporation of a microprocessor enables the time-of-use watt-hour meter to determine and store a plurality of peak demand values for a particular consumer. Since a typical watt-hour meter has severe spatial limitations and high reliability requirements, they are designed to utilize a minimum number of electronic components and, therefore, available memory storage is necessarily limited. Because of this limitation, watt-hour meters that are configured to be used as demand meters typically store three or less demand levels for a particular billing period. These demand levels represent the maximum demand for each rate period which is a simplified historic profile of the consumer's electric energy requirements.

When measuring electrical demand, care must be taken to avoid various situations that can cause misleading information. For example, the consumer's peak energy demand must, of course, be measured over some finite period of time. This period of time must be great enough to avoid being unduly influenced by a solitary energy spike of very short duration. Otherwise, the consumer would be unjustly billed for a peak demand level that occurred only once and for a very short period of time, such as during the startup of a large motor. However, if the peak demand levels are measured over a much longer period of time, peak demand will be incorrectly under-recorded. For example, if a consumer experiences a high electrical demand that lasts for 20 minutes and the demand meter uses a time base of 2 hours, the apparent demand will be much lower than the actual demand. Therefore, in order to record a truly representative demand level, a reasonably short period of time should be used. Historically, a 15-minute interval has been used in order to determine a consumer's peak demand over a 15-minute period.

The use of demand intervals, as discussed above, can also cause another misleading situation. If the consumer has accurate knowledge of the beginnings and endings of the demand intervals, the consumption of electric energy can be timed so as to advantageously span two demand intervals. For example, assuming the consumer has knowledge that a high energy consumption will last 15 minutes and the demand intervals are 15 minutes long, this energy consumption can be timed to begin midway through one demand interval and end midway through the following interval. The effect of this procedure would be to make the apparent demand be significantly less than the actual demand and the electric utility would therefore underbill the consumer. To avoid this strategy, electric utilities sometimes employ a sliding demand interval which is known to those skilled in the art and which will be described in greater detail below. Another problem that typically occurs during the recording of demand information is that the value is recorded with no accompanying indication of its time or date of occurrence. Because of this, neither the electric utility nor the electric energy consumer can properly correlate the demand to a consumption activity.

The present invention provides a time-of-use watt-hour meter that is capable of recording the maximum demand value, its time and date for each rate period and a plurality of individual interval demands with time and date of occurrence of electrical energy consumption which, in a preferred embodiment, is equal to five demands. Furthermore, the present invention is able to discriminate between demand levels that occur within a preselected period of time.

A time-of-use watt-hour meter made in accordance with the present invention comprises a means for measuring electrical energy consumption. Many such measuring means are known to those skilled in the art of electrical measurement. Watt-hour meters of many types are in common use in many diverse applications. Typically, electrical usage is indicated by the rotation of a flat disk and the movement of a plurality of register dial indicators. A metering system for electric utility power line measurements is disclosed in U.S. Pat. No. 4,077,061 which issued to Johnston et al. on Feb. 28, 1978. It incorporates a system sequence controller and calculator that provide programmed control for processing digital control and data signals and for producing digital calculations of electrical energy parameters from the binary representation of the instantaneous signal values. Memory registers are used to total and accumulate digitally calculated values for producing visual displays and output signals that correspond to electric energy parameters that are being measured. A multiple rate meter for totalizing electrical power usage from an alternating current supply is disclosed in U.S. Pat. No. 4,081,746 which issued to Snyder et al. on Mar. 28, 1978. It includes a rotatable member that rotates at a speed which is proportional to the rate of electrical energy usage. Solid-state circuitry is used to time the speed of a rotatable member versus a supply frequency. It provides a multiple rate meter which provides a signal for operating a small electrical solenoid operatively connected to change registers, add a register or change the gear ratios in the drive train of a single register. In a watt-hour meter made in accordance with the present invention, some means for generating pulses, as a function of energy consumption, is used to provide a signal that represents the amount of electrical energy being consumed. A convertible multi-rate dial register for energy consumption meters is disclosed in U.S. Pat. No. 4,365,194 which issued to Halstead et al. on Dec. 21, 1982 and a demand meter for on-peak maximum demand metering is disclosed in U.S. Pat. No. 3,913,014 which issued to Halstead et al. on Oct. 14, 1975.

Various means are known to those skilled in the art for initiating pulses that are representative of the consumption of electrical energy. An opto-electronic pulse initiator for producing meter data pulses from a meter having a rotating movement is disclosed in U.S. Pat. No. 4,034,292 which issued to McClelland on July 5, 1977. A photoelectric pulse initiator that includes a rotating pattern having a single track of indicia scanned by two opto-electronic sensors is disclosed in U.S. Pat. No. 4,047,024 which issued to Henderson on Sept. 6, 1977. U.S. Pat. No. 3,878,391, which issued to McClelland et al. on Apr. 15, 1975, discloses a radiometric pulse initiator for 3-wire remote meter telemetry systems that includes interchangeable reflective pattern drums that have alternative preselectable numbers of reflecting segments for generating desired pulse rate in response to a predetermined amount of rotation of a watt-hour meter movement. Many such pulse initiating devices are known to those skilled in the art and the present invention is not dependent upon one particular pulse initation technique, but can be used in association with any one of a number of devices that are capable of producing a series of pulses where each of the pulses represents a predetermined quantum of electrical energy consumption.

A programmable watt-hour energy meter having a radiation responsive external data interface is disclosed in U.S. Pat. No. 4,298,839 which issued to Johnston on Nov. 3, 1981. It provides an externally programmable time-based measuring system that is disposed in a sealed enclosure for mounting the watt-hour meter at a particular metering location. A radiation sensitive external data interface receives and transmits data encoded radiations through a transparent communications window of the enclosure. This general type of watt-hour meter is suitable for use in association with the present invention. A particular style of time-of-use watt-hour meter is disclosed in U.S. patent application Ser. No. 292,978 which was filed on Aug. 14, 1981 by Benbow. This particular style of time-of-use meter mounts an electronic register directly to a transparent cover of a time-of-use meter.

The present invention relates directly to both demand meters and time-of-use meters. It provides a watt-hour meter that is capable of recording and storing a plurality of demand levels along with the time and date that each of the plurality of demand levels occurred. It also provides a means for avoiding the disadvantageous result that can occur when a sustained period of high demand extends over a plurality of these demand intervals.

A problem that can occur when recording a plurality of demands for a particular consumer is that the demand intervals may be short enough in duration for a sustained period of relatively high energy demand to encompass a plurality of demand intervals. This situation tends to reduce the informational value of the plurality of peak demand levels available to the utility and the consumer. For example, if a demand meter utilizes 15-minute demand intervals, a period of high electrical energy consumption that lasts 75 minutes can provide the five highest 15-minute interval demands during a single continuous time period. The result of this situation would be that the electric utility would obtain information, concerning this particular consumer, that indicates only one long period of high electrical consumption during the billing period. This would be indicated by five demand intervals which are contiguous. Although this information is accurate, it is redundant. What may actually have happened is that the consumer experienced many other periods of high electrical energy consumption that were only slightly less than the five indicated demand intervals. However, since none of the other periods of high electrical consumption were as high as the five contiguous demand intervals, they were not reported and neither the consumer nor the electric utility would be informed of their existence. Since these other periods of high electrical energy demand may be important to both the consumer and the utility, it would be advantageous if a demand meter was provided with an ability to distinguish between demand intervals which are contiguous and take steps to avoid this possibly misleading information. As discussed above, this disadvantageous circumstance can result when all of the plurality of demand levels are contiguous. Although the stored data is accurate, it can be misleading in that all of the demand levels are related to a single sustained period of high electrical energy consumption.

The present invention provides a means for defining a survey period which lasts a preselected amount of time. Another period of time, referred to herein as a demand interval, is defined and used as a precise quantum of time during which electrical energy consumption is measured. In a preferred embodiment of the present invention, the demand interval is less than the survey period. Furthermore, the length of the survey period can be chosen to be an integral multiple of the demand interval. It should be understood that this time relationship between the survey period and the damand interval is not a requirement of the present invention and other relationships between these two time periods can be used in a watt-hour meter made in accordance with the present invention. For example, an alternate embodiment of the present invention could utilize a survey period that is actually shorter than a demand interval.

A watt-hour meter made in accordance with the present invention also comprises a means for measuring electrical energy consumption. As discussed above, this type of measuring means can be any one of a number of electrical metering devices known to those skilled in the art. A means for measuring time is also provided so that the survey period and demand interval can be accurately initiated and terminated. The time measuring means enables the present invention to maintain a calendar and clock so that the exact time and date of energy demand peaks can be recorded and stored. In a preferred embodiment of the present invention, a 60 Hz signal is used to provide a series of timing signals when alternating current power is available. When running on battery power, the timing pulses occur every four seconds in order to reduce the energy drain on a backup battery system.

The present invention also provides a means for selecting the highest interval demand that occurs during each survey period. This highest interval demand is stored, along with the highest interval demands of successive survey periods and a means is provided for comparing each of these highest interval demands to a plurality of stored maximum demands that have previously occurred. Over a sustained period of time, this process results in the storing of the five highest interval demands that have occurred up to the present period of time. This plurality of highest interval demands is maintained and stored during a preselected time interval, such as a billing period.

A microprocessor is used in a preferred embodiment of the present invention to define the survey periods and demand intervals. The microprocessor is also configured to record and store the measured electrical energy consumption that occurs during each demand interval and compare the values to determine and store a preselected number, such as five, of the highest interval demands occurring during a sustained period of time.

A random access memory (RAM) device is associated with the microprocessor of the present invention in order to provide storage of pertinent data and a means for communicating this data to an external device, such as a portable programmer/reader, is also provided. In a preferred embodiment of the present invention, a visual display is used so that an operator can visually determine the values of the preselected number of highest interval demands that have occurred as of any point in time.

BRIEF DESCRIPTION OF THE DRAWING

The present invention will be more fully understood from a reading of the description of the preferred embodiment in conjunction with the drawing, in which:

FIG. 2A shows an exemplary electrical energy consumption profile of a hypothetical consumer and FIG. 2B shows the resulting interval demands provided by the present invention;

DESCRIPTION OF THE PREFERRED EMBODIMENT

The present invention relates generally to time-of-use watt-hour meters, and more particularly, to a time-of-use watt-hour meter that also has the capability of providing demand profile information in a limited memory environment.

Figure 1:
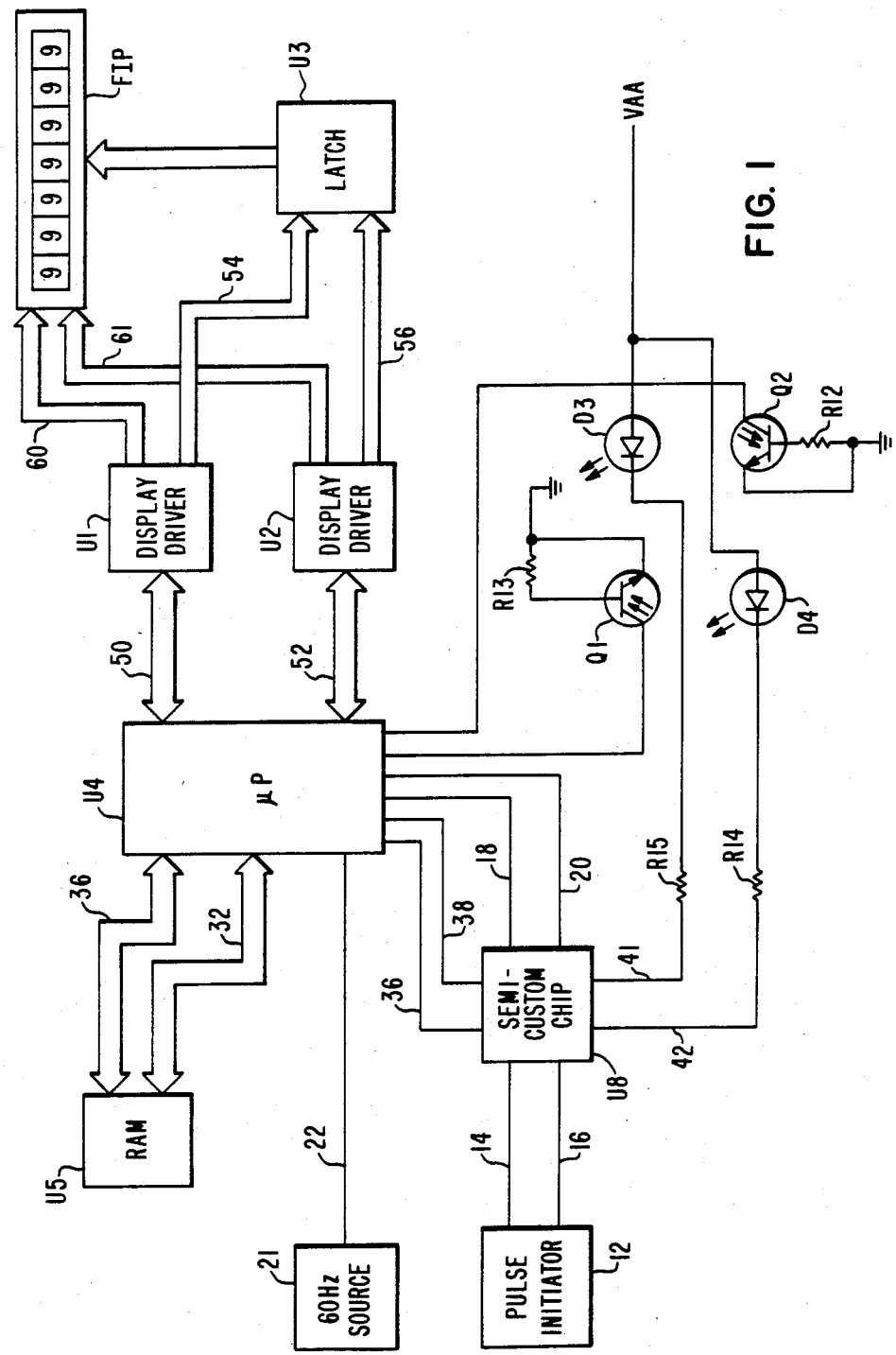
FIG. 1 illustrates a functional block diagram of a time-of-use meter incorporating the present invention.

A time-of-use watt-hour meter made in accordance with the present invention is illustrated in the schematic block diagram of FIG. 1. A microprocessor U4 is used to perform the algorithmic operations and storage functions that will be discussed in more detail below. A preferred embodiment of the present invention utilizes a microprocessor such as type MK38P70/02 or, alternatively, type 3870/40 which are available from the Mostek Corporation. This particular microprocessor is a complete 8-bit microcomputer on a single MOS integrated circuit. It can execute a set of more than 70 instructions and is completely software compatible with other devices of the 3870 single chip micro family of components provided by Mostek. It features 1-4K bytes of ROM and optional additional executable RAM depending upon the specific model. It also features 64 bytes of scratch pad RAM, a programmable binary timer and 32 bits of I/O. The microprocessor U4 is cooperatively associated with a pulse initiator 12 that is capable of providing a stream of pulses in which each pulse is representative of preselected quantum of electrical energy consumption. Various types of pulse initiators have been discussed above and any one of a plurality of pulse initiation devices is suitable for use in the present invention. The pulse initiator 12 transmits its pulses to a semi-custom chip U8 on lines 14 and 16. It should be understood that a single signal line between the pulse initiator 12 and the semi-custom chip U8 can be used to transmit the pulses between these components. However, some types of pulse initiators provide dual signals in order to increase the accuracy of the relationship between pulses and electrical energy consumption. Furthermore, some pulse initiators utilize dual indicia tracks on a rotatable disk that improve reliability and, in some cases, distinguish between forward and reverse rotation of its associated disk. One particular type of pulse initiator that discriminates between forward and reverse rotation of its associated rotatable disk is disclosed in U.S. patent application Ser. No. 647,204 which was filed on Sept. 4, 1984 and assigned to the assignee of the present application.

The semi-custom chip U8 comprises a plurality of inverters that condition the pulse signals prior to transmitting them, on lines 18 and 20, to the microprocessor U4. In a preferred embodiment of the present invention, the semi-custom chip U8 is type MCE538 which is available from the Micro-Circuit Engineering Corporation.

When the pulses are received by the microprocessor U4, each of the pulses represents a specific quantity of electrical energy consumption that has been used by a consumer at whose location the watt-hour meter of the present invention is located. Therefore, each pulse that is received by the microprocessor U4 can be mathematically converted to a quantum of electrical energy by merely multiplying the number of pulses received by a known constant that relates each pulse to a specific amount of electrical energy.

A 60 Hz source 21 is provided and is cooperatively associated with the microprocessor U4, by line 22, to provide the microprocessor U4 with a means for maintaining a clock and calendar system. When AC power is available to the time-to-use watt-hour meter illustrated in FIG. 1, the 60 Hz source 21 is easily maintained. However, when AC power is not available, a battery backup system with a crystal oscillator provides a timing means. Although this battery backup system is not illustrated in FIG. 1, it should be understood that many such systems that are known to those skilled in the art can be utilized for this purpose.

The microprocessor U4 utilizes the 60 Hz source, or an alternative source of timing signals, as a basic unit of time measurement for the maintenance of clock and calendar systems. It maintains data registers that store updated values for the hour, minute and second of the day along with registers that maintain the current value of the day of the year, day of the week, month, date and other associated calendar values. Using the timing pulses, the present invention defines both demand intervals and survey periods. Each billing or maintenance period comprises a plurality of survey periods. Each survey period, in a preferred embodiment of the present invention, comprises a plurality of demand intervals. It is convenient to define the length of the demand intervals and survey periods in such a way that each survey period is an integer multiple of the length of the demand interval. However, it should be understood that this particular relationship is not a necessity in the preferred embodiment of the present invention. Alternative relationships between the survey periods and demand intervals are possible.

As the series of pulses are received by the microprocessor U4, on lines 18 and 20, their represented quantity of electrical energy consumption is maintained in a register that stores the accumulated total of electrical energy consumption during the current demand interval. At the end of the demand interval, the total electrical consumption that occurred during that demand interval, referred to herein as the interval demand, is compared to previously recorded interval demands that have been accumulated during the current survey period. If the current interval demand is greater than other interval demands within the current survey period, its value is saved for future comparison to subsequent interval demands within the current survey period. At the end of each survey period, the highest interval demand that occurred during the survey period is stored and compared to previously accumulated peak interval demands from previous survey periods. In this way, the present invention is able to maintain a preselected number of the highest interval demands that have occurred during the maintenance, or billing, period. In a preferred embodiment of the present invention, this preselected number of highest interval demands is five, but it should be understood that other numbers of highest interval demands is possible.

Each time that a new highest interval demand for a given survey period is determined, it is compared to the previously stored five highest interval demands described above. If the most recently accumulated interval demand is higher than the lowest of the five peak demand values, the lowest of the five values is replaced by the current maximum interval demand and the newly determined five highest interval demands are used for subsequent similar comparisons. Therefore, at any given time, the five highest interval demands that have occurred during a given period of time are available. These registers, and other data registers used by the microprocessor U4, are stored in a random access memory (RAM) device U5. The RAM U5 is operatively associated with the microprocessor U4 by data buses 30 and 32. If the microprocessor U4 determines that one of these variables must be updated, it accesses the pertinent registers from RAM U5 into its memory and manipulates the data appropriately. Following this manipulation of data values, the registers are again stored in RAM U5 until further changes are indicated.

In order to communicate its stored values to a device which is external to the time-of-use watt-hour meter of the present invention, the microprocessor U4 is operatively connected to photodiodes, D3 and D4, and phototransistors Q1 and Q2. The photodiodes, D3 and D4, enable the microprocessor U4 to transmit optical signals that can be received by an external device, such as a programmer/reader. Similarly, the phototransistors Q1 and Q2 enable the microprocessor U4 to receive optical signals from an external device. Digital data, such as the five highest interval demands discussed above, is transmitted by the microprocessor U4 to the light-emitting diodes, D3 and D4, through the semi-custom chip U8. Microprocessor U4 sends its output signals, on lines 36 and 38, to the semi-custom chip U8 which, in turn, transmits those signals to the light-emitting diodes, D3 and D4, on lines 41 and 42, respectively.

In a preferred embodiment of the present invention, diodes D3 and D4 are type ME7145 and are available from Texas Instruments Corporation. The phototransistors, Q1 and Q2, are type LS8047 and are available from Texas Instruments Corporation. These light-emitting diodes and phototransistors, in a preferred embodiment of the present invention, are arranged in an interface module that is configured to be associated with a similar interface module of a portable programmer/reader. This type of configuration is disclosed in U.S. Pat. No. 4,298,839 which is hereby incorporated by reference. This type of interface module is also described in U.S. Pat. No. 4,491,789 which was filed by Benbow on Aug. 14, 1981, and issued on Jan. 1, 1985. By sending optical signals with the light-emitting diodes, D3 and D4, and receiving optical signals by the phototransistors, Q1 and Q2, the time-of-use watt-hour meter of the present invention is able to communicate with an external device, such as the above-described programmer/reader. As illustrated in FIG. 1, the light-emitting diodes, D3 and D4, have resistors R15 and R14, respectively, connected electrically in series between them and the semi-custom chip U8. The phototransistors, Q1 and Q2, each have a resistor, R13 and R12, respectively, connected between their respective bases and emitters. The cathodes of the light-emitting diodes are connected to a power supply voltage VAA.

Another means for communicating the information stored in both the microprocessor U4 and RAM U5 is the fluorescent indicator panel FIP which is illustrated in FIG. 1. This panel FIP is a multi-digit indicator and, in a preferred embodiment of the present invention, is type 9A5 which is available from the Nippon Electric Company. The microprocessor U4 communicates its data, which is to be displayed on the FIP, by transmitting it to display drivers, U1 and U2 which, in turn, communicate with the FIP. The microprocessor U4 is operatively connected to the display drivers U1 and U2, by data buses 50 and 52. The display drivers, U1 and U2, are type UDN611A which are available from the Sprague Electric Company.

Each of the display drivers, U1 and U2, are operatively associated with a latch U3. The latch U3 is an addressable latch, such as type 14099BCL which is available from the Motorola Corporation. The display drivers U1 are connected to the latch U3 by data buses 54 and 56, respectively, and are connected to the FIP by data buses 60 and 61, respectively. Because of design considerations relating to the preferred embodiment of the present invention, address and data information are mixed to each driver. The information received by the latch U3 is address information and the information going directly to the display from the drivers is data information.

An exemplary discussion of the operation of the present invention will be described below in relation to FIGS. 2A and 2B. In FIG. 2A, curve 70 represents a hypothetical profile of a consumer's electrical energy consumption. It depicts the consumer's electrical consumption as a function of time. The units of electrical consumption in FIG. 2A have been chosen for illustration purposes only and do not necessarily represent a particular unit of energy, such as watt-hours.

Since FIG. 2A represents cumulative electrical energy consumption, curve 70 is shown to be continually rising over time. Furthermore, curve 70 is shown with a plurality of time divisions that each represent a demand interval DI. A survey period SP is also shown in FIG. 2A and, in this example, the survey period SP is equivalent to exactly four demand intervals DI. However, it should be understood that this particular relationship between the length of a survey period SP and the length of a demand interval DI is not a requirement of the present invention.

During each demand interval DI, the present invention accumulates incoming pulses that each represent a preselected quantity of electrical consumption. These pulses, and their represented electrical energy value are accumulated during the span of each demand interval. The exemplary magnitudes of the interval demands are illustrated in FIG. 2B. As can be seen by comparing FIGS. 2A and 2B, the magnitude of each of the interval demands represents the slope of curve 70 during its related demand interval.

Beginning at time zero, it will be assumed that all demand registers are initialized to zero. The accumulation of energy-related input pulses by the microprocessor U4, as shown in FIGS. 2A and 2B, results in an interval demand of two units during the first demand interval of curve 70. At the end of this first demand interval, this interval demand would, of course, represent the highest interval demand seen during the first survey period. This value of two units would, therefore, represent the peak demand occurring during the initial survey period and would be stored in a register, along with its time and date of occurrence, within the microprocessor U4 and RAM U5. At the beginning of the second demand interval, the interval demand register would be initially cleared and again be used to accumulate incoming electrical energy consumption. It should be understood that the interval demand is monitored throughout the entire demand interval and not only at the end of the demand intervals. Furthermore, it should be understood that the survey period maximum demand is compared to the five highest values only at the end of the survey period.

As shown in the hypothetical profile of FIGS. 2A and 2B, the interval demand of the second demand interval would also be equal to two units. At the end of the second demand interval, therefore, this interval demand would be compared with the highest interval demand seen during the survey period. Of course, in this example, both the interval demand and the maximum interval demand would be equal to two and no change would be indicated. However, at the end of the third demand interval, as shown in FIG. 2B, an interval demand of 2.5 units is accumulated. Therefore, after comparing this value of the most recent interval demand to the maximum interval demand stored for the survey period, the register of maximum survey period demand would be changed to contain a value of 2.5. This procedure would continue and, during the fourth demand interval, an interval demand of 3.0 would be accumulated. Following the above-described procedure, the value stored for the maximum interval demand of the first survey period would be 3.0. At the end of each survey period SP, the present invention stores the maximum interval demand that was seen during the survey period. In this example, the highest interval demand is shown as ID1 and is equivalent to three units of electrical energy consumption. This value is stored in one of a plurality of maximum survey period demands within the memory of the microprocessor U4 and RAM U5. In a preferred embodiment of the present invention, five such maximum survey period demand registers are used. However, it should be understood that any preselected number of maximum survey period demand registers can be used, depending upon the particular requirements of the application. From the above discussion, it should also be understood that, at the end of each demand interval, the interval demand counter is cleared and a new accumulation of energy consumption is begun.

Continuing with this hypothetical example, at the end of the first survey period SP, one of the maximum survey period demand registers would be equal to 3.0 and the other four would be equal to zero. As the time of the second survey period passes, the present invention would follow the above-described algorithm and the result of these calculations would indicate that the interval demand ID2 was the highest interval demand occurring during the second survey period SP2. At the end of the second survey period SP2, the present invention would compare the magnitude of the interval demand ID2 to the five values of maximum survey period demand. Since four of the five maximum survey period demands are still equal to zero from the initialization, the value of ID2, which is 2.5, would be greater than the smallest value stored in these five maximum survey period demand registers. Therefore, at the end of the second survey period SP2, the five maximum survey period demand registers would contain the values of 3.0, 2.5, 0, 0 and 0. During the third survey period SP3, the maximum interval demand ID3 is shown as being equal to 0.7 units of electrical energy consumption. Therefore, at the end of survey period SP3, the five highest survey period demand registers would contain the values of 3.0, 2.5, 0.7, 0 and 0. Table I illustrates the values of the pertinent registers at the end of each of the demand intervals shown in FIGS. 2A and 2B. In Table I, the interval demand measured at the end of each demand interval, the maximum survey period demand at that time and the five highest survey period demand registers are illustrated. For the purposes of this exemplary discussion, 72 demand intervals and 18 survey periods are shown in FIGS. 2A and 2B and in Table I.

TABLE I

| DEMAND INTERVAL | SURVEY PERIOD | ACCUM ENERGY CONSUMPTION | INTERVAL DEMAND | MAX SURVEY PERIOD DEMAND | 5 HIGHEST SURVEY PERIOD DEMANDS | | | | |
|---|---|---|---|---|---|---|---|---|---|
| | | | | | A | B | C | D | E |
| 1 | SP1 | 2.0 | 2.0 | 2.0 | 0 | 0 | 0 | 0 | 0 |
| 2 | SP1 | 4.0 | 2.0 | 2.0 | 0 | 0 | 0 | 0 | 0 |
| 3 | SP1 | 6.5 | 2.5 | 2.5 | 0 | 0 | 0 | 0 | 0 |
| 4 | SP1 | 9.5 | 3.0 | 3.0 | 3.0 | 0 | 0 | 0 | 0 |
| 5 | SP2 | 12.0 | 2.5 | 2.5 | 3.0 | 0 | 0 | 0 | 0 |
| 6 | SP2 | 13.0 | 1.0 | 2.5 | 3.0 | 0 | 0 | 0 | 0 |
| 7 | SP2 | 14.0 | 1.0 | 2.5 | 3.0 | 0 | 0 | 0 | 0 |
| 8 | SP2 | 14.8 | 0.8 | 2.5 | 3.0 | 2.5 | 0 | 0 | 0 |
| 9 | SP3 | 15.2 | 0.4 | 0.4 | 3.0 | 2.5 | 0 | 0 | 0 |
| 10 | SP3 | 15.6 | 0.4 | 0.4 | 3.0 | 2.5 | 0 | 0 | 0 |
| 11 | SP3 | 16.1 | 0.5 | 0.5 | 3.0 | 2.5 | 0 | 0 | 0 |
| 12 | SP3 | 16.8 | 0.7 | 0.7 | 3.0 | 2.5 | 0.7 | 0 | 0 |
| 13 | SP4 | 18.5 | 1.7 | 1.7 | 3.0 | 2.5 | 0.7 | 0 | 0 |
| 14 | SP4 | 21.5 | 3.0 | 3.3 | 3.0 | 2.5 | 0.7 | 0 | 0 |
| 15 | SP4 | 25.0 | 3.5 | 3.5 | 3.0 | 2.5 | 0.7 | 0 | 0 |
| 16 | SP4 | 27.5 | 2.5 | 3.5 | 3.5 | 3.0 | 2.5 | 0.7 | 0 |
| 17 | SP5 | 29.0 | 1.5 | 1.5 | 3.5 | 3.0 | 2.5 | 0.7 | 0 |
| 18 | SP5 | 30.2 | 1.2 | 1.5 | 3.5 | 3.0 | 2.5 | 0.7 | 0 |
| 19 | SP5 | 31.0 | 0.8 | 1.5 | 3.5 | 3.0 | 2.5 | 0.7 | 0 |
| 20 | SP5 | 32.0 | 1.0 | 1.5 | 3.5 | 3.0 | 2.5 | 1.5 | 0.7 |
| 21 | SP6 | 32.5 | 0.5 | .5 | 3.5 | 3.0 | 2.5 | 1.5 | 0.7 |
| 22 | SP6 | 33.2 | 0.7 | .7 | 3.5 | 3.0 | 2.5 | 1.5 | 0.7 |
| 23 | SP6 | 33.5 | 0.3 | .7 | 3.5 | 3.0 | 2.5 | 1.5 | 0.7 |
| 24 | SP6 | 34.2 | 0.7 | .7 | 3.5 | 3.0 | 2.5 | 1.5 | 0.7 |
| 25 | SP7 | 35.0 | 0.8 | .8 | 3.5 | 3.0 | 2.5 | 1.5 | 0.7 |
| 26 | SP7 | 35.2 | 0.2 | .8 | 3.5 | 3.0 | 2.5 | 1.5 | 0.7 |
| 27 | SP7 | 36.0 | 0.8 | .8 | 3.5 | 3.0 | 2.5 | 1.5 | 0.7 |
| 28 | SP7 | 36.5 | 0.5 | .8 | 3.5 | 3.0 | 2.5 | 1.5 | 0.8 |
| 29 | SP8 | 37.5 | 1.0 | 1.0 | 3.5 | 3.0 | 2.5 | 1.5 | 0.8 |
| 30 | SP8 | 40.0 | 2.5 | 2.5 | 3.5 | 3.0 | 2.5 | 1.5 | 0.8 |
| 31 | SP8 | 43.5 | 3.5 | 3.5 | 3.5 | 3.0 | 2.5 | 1.5 | 0.8 |
| 32 | SP8 | 47.0 | 3.5 | 3.5 | 3.5 | 3.5 | 3.0 | 2.5 | 1.5 |
| 33 | SP9 | 50.0 | 3.0 | 3.0 | 3.5 | 3.5 | 3.0 | 2.5 | 1.5 |
| 34 | SP9 | 51.5 | 1.5 | 3.0 | 3.5 | 3.5 | 3.0 | 2.5 | 1.5 |
| 35 | SP9 | 52.1 | 0.6 | 3.0 | 3.5 | 3.5 | 3.0 | 2.5 | 1.5 |
| 36 | SP9 | 52.5 | 0.4 | 3.0 | 3.5 | 3.5 | 3.0 | 3.0 | 2.5 |
| 37 | SP10 | 52.6 | 0.1 | .1 | 3.5 | 3.5 | 3.0 | 3.0 | 2.5 |
| 38 | SP10 | 53 | 0.4 | .4 | 3.5 | 3.5 | 3.0 | 3.0 | 2.5 |
| 39 | SP10 | 53.1 | 0.1 | .4 | 3.5 | 3.5 | 3.0 | 3.0 | 2.5 |
| 40 | SP10 | 53.2 | 0.1 | .4 | 3.5 | 3.5 | 3.0 | 3.0 | 2.5 |
| 41 | SP11 | 53.5 | 0.3 | .3 | 3.5 | 3.5 | 3.0 | 3.0 | 2.5 |
| 42 | SP11 | 54.0 | 0.5 | .5 | 3.5 | 3.5 | 3.0 | 3.0 | 2.5 |
| 43 | SP11 | 55.0 | 1.0 | 1.0 | 3.5 | 3.5 | 3.0 | 3.0 | 2.5 |
| 44 | SP11 | 56.0 | 1.0 | 1.0 | 3.5 | 3.5 | 3.0 | 3.0 | 2.5 |
| 45 | SP12 | 58.5 | 2.5 | 2.5 | 3.5 | 3.5 | 3.0 | 3.0 | 2.5 |
| 46 | SP12 | 61.0 | 2.5 | 2.5 | 3.5 | 3.5 | 3.0 | 3.0 | 2.5 |
| 47 | SP12 | 63.0 | 2.0 | 2.5 | 3.5 | 3.5 | 3.0 | 3.0 | 2.5 |
| 48 | SP12 | 64.0 | 1.0 | 2.5 | 3.5 | 3.5 | 3.0 | 3.0 | 2.5 |
| 49 | SP13 | 64.5 | 0.5 | .5 | 3.5 | 3.5 | 3.0 | 3.0 | 2.5 |
| 50 | SP13 | 65.0 | 0.5 | .5 | 3.5 | 3.5 | 3.0 | 3.0 | 2.5 |
| 51 | SP13 | 65.5 | 0.5 | .5 | 3.5 | 3.5 | 3.0 | 3.0 | 2.5 |
| 52 | SP13 | 66.0 | 0.5 | .5 | 3.5 | 3.5 | 3.0 | 3.0 | 2.5 |
| 53 | SP14 | 66.1 | 0.1 | .1 | 3.5 | 3.5 | 3.0 | 3.0 | 2.5 |
| 54 | SP14 | 66.5 | 0.4 | .4 | 3.5 | 3.5 | 3.0 | 3.0 | 2.5 |
| 55 | SP14 | 67.0 | 0.5 | .5 | 3.5 | 3.5 | 3.0 | 3.0 | 2.5 |
| 56 | SP14 | 67.3 | 0.3 | .5 | 3.5 | 3.5 | 3.0 | 3.0 | 2.5 |
| 57 | SP15 | 67.8 | 0.5 | .5 | 3.5 | 3.5 | 3.0 | 3.0 | 2.5 |
| 58 | SP15 | 68.0 | 0.2 | .5 | 3.5 | 3.5 | 3.0 | 3.0 | 2.5 |
| 59 | SP15 | 68.5 | 0.5 | .5 | 3.5 | 3.5 | 3.0 | 3.0 | 2.5 |
| 60 | SP15 | 69.0 | 0.5 | .5 | 3.5 | 3.5 | 3.0 | 3.0 | 2.5 |
| 61 | SP16 | 70.0 | 1.0 | 1.0 | 3.5 | 3.5 | 3.0 | 3.0 | 2.5 |
| 62 | SP16 | 71.0 | 1.0 | 1.0 | 3.5 | 3.5 | 3.0 | 3.0 | 2.5 |
| 63 | SP16 | 72.1 | 1.1 | 1.1 | 3.5 | 3.5 | 3.0 | 3.0 | 2.5 |
| 64 | SP16 | 73.6 | 1.5 | 1.5 | 3.5 | 3.5 | 3.0 | 3.0 | 2.5 |
| 65 | SP17 | 75.5 | 1.9 | 1.9 | 3.5 | 3.5 | 3.0 | 3.0 | 2.5 |
| 66 | SP17 | 77.0 | 1.5 | 1.9 | 3.5 | 3.5 | 3.0 | 3.0 | 2.5 |
| 67 | SP17 | 77.6 | 0.6 | 1.9 | 3.5 | 3.5 | 3.0 | 3.0 | 2.5 |
| 68 | SP17 | 78.0 | 1.4 | 1.9 | 3.5 | 3.5 | 3.0 | 3.0 | 2.5 |
| 69 | SP18 | 78.4 | 0.4 | .4 | 3.5 | 3.5 | 3.0 | 3.0 | 2.5 |
| 70 | SP18 | 79.0 | 0.6 | .6 | 3.5 | 3.5 | 3.0 | 3.0 | 2.5 |
| 71 | SP18 | 79.4 | 0.4 | .6 | 3.5 | 3.5 | 3.0 | 3.0 | 2.5 |
| 72 | SP18 | 80.0 | 0.6 | .6 | 3.5 | 3.5 | 3.0 | 3.0 | 2.5 |

During the period of time illustrated in FIGS. 2A and 2B, the algorithmic procedure described above would continue. Each of the survey periods in FIGS. 2A and 2B are shown with their associated highest interval demand (i.e., ID1, ID2, ID3 . . . ID18). Following the procedure described above, the present invention would compare each of these interval demands not only with the other interval demands within the same survey period SP, but with the 5 highest survey period demand registers. At the end of the 18th survey period, the 5 highest survey period demands, for this particular hypothetical example, would be interval demands ID4, ID8, ID1, ID9 and ID2.

Referring specifically to FIG. 2B, one of the advantages of the present invention should be apparent. It has the beneficial effect of avoiding multiple interval demands being registered for the same survey period. For example, if a demand meter was configured to merely save the 5 highest interval demands seen during a billing period, the energy consumption during both the 3rd and 4th demand intervals of the 8th survey period would be stored. Although not obvious from this example, a period of high energy consumption that lasts for 2 or 3 contiguous survey periods could easily result in all 5 maximum interval demands being sequential. Although factually correct, this result would mask the true condition that occurred during the pertinent time period since one of the purposes of demand metering is to illustrate, for both the electric utility and the consumer, the periods during the billing period when most electrical energy was consumed. The present invention aids in this function. Since only one maximum survey period demand is stored for each individual survey period, the present invention tends to spread the interval demands over a plurality of survey periods. In FIG. 2B, although this example is purely hypothetical, it can be seen that the electric utility and the consumer would be provided with information that indicated that a high energy consumption occurred during 3 periods of time. At the end of the first survey period SP1, midway through the fourth survey period SP4 and midway through the eighth survey period SP8, a high amount of electrical energy was consumed by this particular hypothetical consumer. Although not particularly illustrated in FIGS. 2A and 2B, it should be apparent to one skilled in the art that the present invention avoids the likely occurrence of all 5 maximum interval demands being registered during a single-period of high electrical consumption. The time and date are recorded for each occurrence and the electric utility or the electric energy consumer can identify trends or particular causes for high demand periods.

As discussed above, sophisticated electrical energy consumers can schedule their energy use in relation to the beginnings and endings of demand intervals if these are known. Referring again to FIG. 2B, a consumer could possible have advanced the energy consumption, in the fourth survey period SP4, to a slightly accelerated level midway during the second demand interval of that survey period. The effect of this procedure would be to slightly raise the interval demand occurring during that second demand interval and correspondingly lower the interval demand ID4 that occurs during the third demand interval of the fourth survey period. The net effect of this procedure would be to lower interval demand ID4 and thus possibly affect the overall billing of the consumer. Although FIG. 2B does not indicate a interval demand pattern in which this procedure would be significantly effective, one skilled in the art should be able to readily imagine the effectiveness of this procedure if a relatively short, high consumption period can be predicted in advance and the beginnings and endings of the demand intervals are known.

In order to avoid this type of demand reducing procedure, a sliding demand interval can be used in an alternative embodiment of the present invention. Although the survey periods could be set identical to those illustrated in FIGS. 2A and 2B, the demand intervals would not begin and end at predetermined times. Instead, a sliding demand interval would be used.

For purposes of the explanation of this alternative embodiment of the present invention, particularly lengths of time for the survey periods and demand interval period will be used. For example, using a survey period of 1 hour and a demand interval of 15 minutes, the demand interval would be represented in the microprocessor U4 of the present invention by 15 individual registers, each representing 1 minute of time. Using an appropriate pointer, the electrical energy consumption during each successive minute of time would be accumulated in a separate one of the 15 registers. After 15 registers (i.e., 15 minutes) have been used, register 1 would again be used to accumulate energy consumption. By sliding the pointer from register to register, a sliding demand interval is created. At the end of each minute of time, the 15 registers are totaled and an interval demand is calculated. This interval demand is compared to previously determined interval demands during each survey period. The rest of the present invention operates as described above in relation to the preferred embodiment of the present invention. The only significant difference between the alternative embodiment and the preferred embodiment is that 60 distinct interval demands, each one minute longer, are calculated during each survey period.

Table II illustrates a plurality of the sub-interval demand values and the resulting sliding demand interval value. Furthermore, Table II illustrates the maximum survey period demand that would be determined at the end of each sub-interval. As described above, in the particular hypothetical sample, each sub-interval would be 1 minute long and 60 sub-intervals would occur during each 60 minute survey period.

TABLE II

| SUB-INTERVAL NUMBER | DEMAND DURING SUB-INTERVAL | SLIDING DEMAND | MAXIMUM SURVEY PERIOD DEMAND |
|---|---|---|---|
| 1 | 6 | 6 | 6* |
| 2 | 7 | 13 | 13* |
| 3 | 7 | 20 | 20* |
| 4 | 6 | 26 | 26* |
| 5 | 5 | 31 | 31* |
| 6 | 5 | 36 | 36* |
| 7 | 4 | 40 | 40* |
| 8 | 3 | 43 | 43* |
| 9 | 3 | 46 | 46* |
| 10 | 3 | 49 | 49* |
| 11 | 2 | 51 | 51* |
| 12 | 2 | 53 | 53* |
| 13 | 2 | 55 | 55* |
| 14 | 3 | 58 | 58* |
| 15 | 3 | 61 | 61* |
| 16 | 3 | 58 | 61 |
| 17 | 4 | 55 | 61 |
| 18 | 5 | 53 | 61 |
| 19 | 6 | 53 | 61 |
| 20 | 7 | 55 | 61 |
| 21 | 6 | 56 | 61 |
| 22 | 5 | 57 | 61 |
| 23 | 3 | 57 | 61 |
| 24 | 2 | 56 | 61 |
| 25 | 2 | 55 | 61 |
| 26 | 4 | 57 | 61 |
| 27 | 5 | 60 | 61 |
| 28 | 6 | 64 | 64* |

TABLE II-continued

| SUB-INTERVAL NUMBER | DEMAND DURING SUB-INTERVAL | SLIDING DEMAND | MAXIMUM SURVEY PERIOD DEMAND |
|---|---|---|---|
| 29 | 7 | 68 | 68* |
| 30 | 8 | 73 | 73* |
| 31 | 8 | 78 | 78* |
| 32 | 9 | 83 | 83* |
| 33 | 9 | 87 | 87* |
| 34 | 7 | 88 | 88* |
| 35 | 6 | 87 | 88 |
| 36 | 5 | 86 | 88 |
| 37 | 4 | 85 | 88 |

*New maximum demand

Upon the occurrence of each new maximum survey period demand, the magnitude of the demand and the time and date are recorded and stored until the occurrence of a new maximum survey period demand is seen. At the end of each survey period, the maximum survey period demand is stored in one of the 5 maximum survey period demand registers and the values of these registers are treated as described above in the description of the preferred embodiment. Under normal conditions, the results obtained using the sliding demand interval would be approximately the same as those obtained using the fixed demand intervals described above. However, an advantage of the use of a sliding demand interval is that it prevents the masking of short-duration high-energy consumption by sophisticated consumers.

Figure 3:
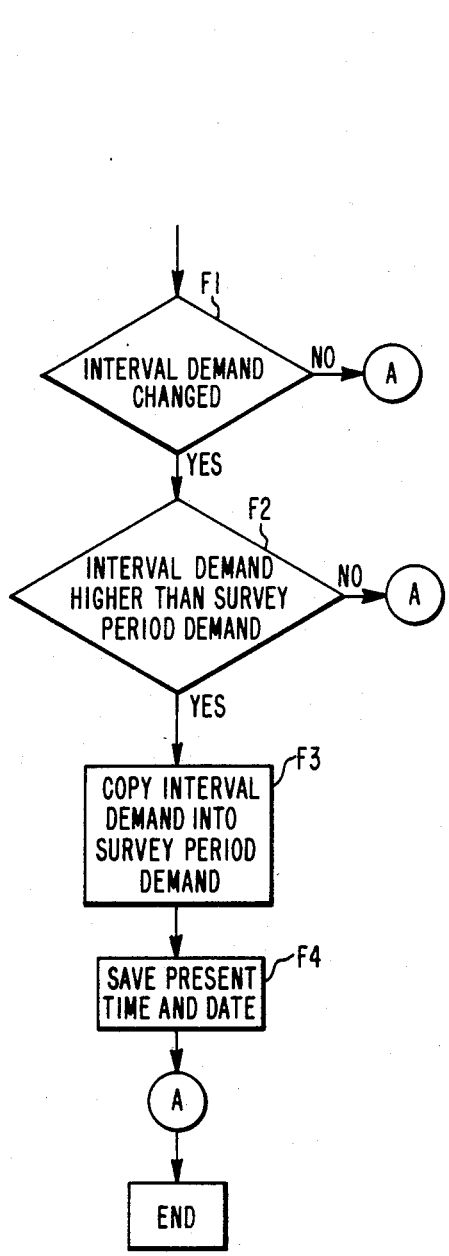
FIG. 3 shows a flow chart of a portion of the present invention that is executed upon each change of a measured interval demand.

Many of the functions of the present invention are performed by the microprocessor U4. FIG. 3 illustrates a flow chart of a portion of one of the programs stored in the microprocessor U4. Periodically, the program illustrated by the flow chart in FIG. 3 is executed. As indicated by block F1, the program first determines whether or not the current interval demand value has changed. A change in the current interval demand would be caused by the receipt of a pulse, on lines 18 and 20, from the semi-custom chip U8. If no change is seen in the interval demand, the program illustrated in FIG. 3 ceases execution. If a change is seen in the interval demand, the program executes the logic illustrated by block F2. It compares the magnitude of the current interval demand to the highest survey period demand to determine whether or not new survey period demand maximum value has occurred. If it has not occurred, the program terminates execution. If a new maximum survey period demand has occurred, the program copies the interval demand into the maximum period demand, as indicated by block F3, and saves the present time and date as indicated by block F4. Following this capture of the highest interval demand that has occurred during a particular survey period, the program illustrated by the flow chart in FIG. 3 terminates execution. The result of this programming sequence is to constantly maintain a register that contains the maximum interval demand that has occurred during each survey period. That value, along with the time and date of its occurrence, is saved until the end of each survey period and then compared to the previously stored five maximum survey period demands discussed above.

Figure 4:
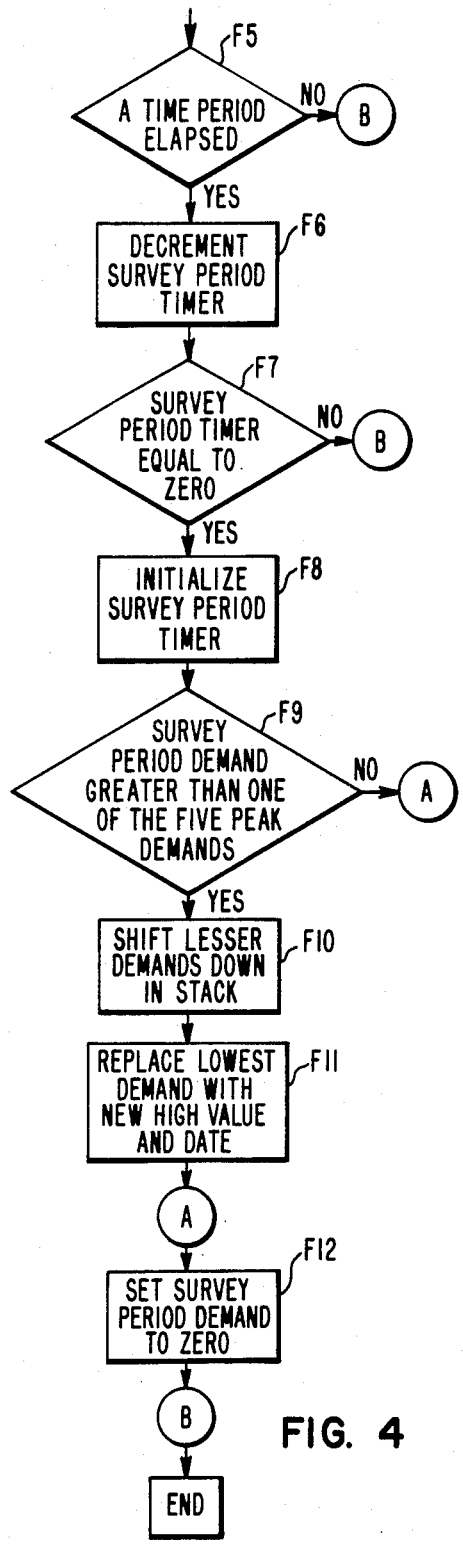
FIG. 4 illustrates a flow chart of a portion of the present invention that is executed each time that a time period elapses.

The flow chart of FIG. 4 illustrates the algorithmic manipulation of the survey period values that was described above in conjunction with FIGS. 2A and 2B. It should be understood that the program illustrated by the flow chart in FIG. 4 does not necessarily follow sequentially after the program represented by the flow chart in FIG. 3.

As indicated by FIG. 4, this portion of the progam begins by determining if a time period has elapsed, as indicated by block F5. If not, the program terminates execution. If a time period has elapsed, the program decrements a survey period timer, as indicated by block F6, in order that the time elapsed during a survey period can be accurately regulated. Following this decrementing of the survey period timer, the program checks to see if the survey period timer has been decremented to zero. As illustrted by block F7, if this has not occurred, the program terminates execution. However, if a survey period timer has been decremented to zero, the program initializes the survey period timer as indicated by block F8, and compares the survey period demand to the five maximum survey period demands stored in individual registers. As shown by block F9, if the survey period demand for the most recent survey period is not greater than any of the five maximum survey period demands, the program clears the survey period demand to zero, as indicated by block F12, and terminates execution. However, if the current survey period demand is greater than one of the five previously stored maximum survey period demands, the new survey period demand replaces the lowest of the five maximum survey period demands and the values are shifted through the stack of survey period demands, as illustrated by block F10. The results of the operation indicated by blocks F10 and F11 are that the current survey period demand replaces the lowest of the five maximum survey period demands stored in the registers described above and the five maximum survey period demand registers are arranged in descending order. Then, as shown in block F12, the survey period demand is cleared to zero for the beginning of a new survey period.

Referring again to FIG. 1, the programs represented by the flow charts of FIGS. 3 and 4 are stored in microprocessor U4. The registers that contain the values of the demand intervals, survey period demand and five maximum survey period demands, among others, are manipulated in the microprocessor U4 and stored in RAM U5. The timing pulses which are necessary for the maintenance of a clock and a calendar system are received by the microprocessor U4 on line 22. The pulses which represent specific quantities of electrical energy consumption are provided by the pulse initiator 12, through the semi-custom chip U8, on lines 18 and 20 to the microprocessor U4. The microprocessor U4 can communicate the results of its metering in two basic ways. First, it can transmit optical signals, by the light-emitting diodes D3 and D4, to an external device such as a portable programmer/reader. Also, the microprocessor U4 can display its results on the FIP by communicating data to the display drivers U1 and U2. Table III illustrates the pertinent components used in the preferred embodiment of the present invention.

TABLE III

| REFERENCE NUMERAL | TYPE OR VALUE |
|---|---|
| U1 | TYPE UDN 6118A |
| U2 | TYPE UDN 6118A |
| U3 | TYPE 14099BCL |
| U4 | TYPE MK 30P70/02 or MK 3870/40 |
| U5 | TYPE 6514 or 6541 |
| U8 | TYPE MDA 2753 |
| D3 | TYPE ME 7145 |
| D4 | TYPE ME 7145 |

TABLE III-continued

| REFERENCE NUMERAL | TYPE OR VALUE |
|---|---|
| Q1 | TYPE LS 8047 |
| Q2 | TYPE LS 8047 |
| R12 | 2 M LΩ |
| R13 | 2 M LΩ |
| R14 | 120 LΩ |
| R15 | 120 LΩ |
| FIP | TYPE 9J5 |

Although the preferred embodiment and alternative embodiment of the present invention have been described with particular specificity in the Figures and the discussion above, it should be understood that the present invention should not be considered to be so limited. Other alternative embodiments should be considered to be within the scope of the present invention. For example, although specific lengths of demand intervals and survey periods were used in the discussion above for the purposes of describing the present invention, these particular time periods are not a limitation of the present invention.

What I claim is:

1. A time-of-use watt-hour meter, comprising:
first means for measuring electrical energy consumption;
second means for measuring time;
first means for defining a survey period, said survey period comprising a first preselected amount of time, said first defining means being cooperatively associated with said second measuring means;
second means for defining a demand interval, said demand interval comprising a second preselected amount of time, said second defining means being cooperatively associated with said second measuring means;
means for accumulating an interval demand of said electrical energy consumption that is consumed during said demand interval;
means for selecting the highest demand accumulated during said survey period;
first means for storing said highest interval demand;
means for determining a preselected number of said survey period demands that are higher than others of said survey period demands, said preselected number being greater than one.

2. The meter of claim 1, wherein:
said preselected number of said plurality of survey periods is five.

3. The meter of claim 1, wherein:
said survey period is longer than said demand interval.

4. The meter of claim 1, wherein:
a microprocessor comprises said first and second defining means, said accumulating means, said selecting means, said storing means and said determining means.

5. The meter of claim 4, further comprising:
a random access memory device operatively associated with said microprocessor.

6. The meter of claim 4, further comprising:
an indicator panel operatively associated with said microprocessor, said indicator panel having a plurality of visible characters for indicating one or more of said preselected number of said survey period demands.

7. The meter of claim 4, further comprising:
means for communicating digital information to a remote device.

8. The meter of claim 7, wherein:
said communicating means comprises a plurality of light-emitting diodes and a plurality of phototransistors.

9. A watt-hour meter, comprising:
means for providing a series of timing signals;
first means for defining a plurality of demand intervals, each of said plurality of demand intervals being equivalent to a first preselected number of said timing signals;
second means for defining a plurality of survey periods, each of said plurality of survey periods being equivalent to a second preselected number of said timing signals;
means for measuring electrical energy consumption;
first means for determining the interval demand of said electrical energy consumption that is consumed during each of said plurality of demand intervals;
second means for determining the highest interval demand for each of said plurality of survey periods; and
third means for determining a preselected number of the highest of a plurality of said highest interval demands, each of said plurality of said highest interval demands being the highest interval demand occurring during a different survey period, said preselected number being greater than one.

10. The meter of claim 9, wherein:
said demand interval is a sliding time period.

11. The meter of claim 9, wherein:
said first preselected number of said timing pulses is less than said second preselected number of said timing signals.

12. The meter of claim 9, further comprising:
a microcomputer, said microcomputer comprising said first and second defining means and said first, second and third determining means.

13. The meter of claim 12, further comprising:
means for displaying said preselected number of the highest of a plurality of said highest interval demands.

14. The meter of claim 12, further comprising:
means for communicating digital signals to an external device, said communicating means being operatively associated with said microcomputer.

15. A method for measuring electrical energy demand, comprising:
providing a series of timing signals;
defining a plurality of demand intervals, each of said plurality of demand intervals being equivalent to a first preselected number of said timing signals;
defining a plurality of survey periods, each of said plurality of survey periods being equivalent to a second preselected number of said timing signals;
measuring electrical energy consumption;
determining the interval demand of said electrical energy consumption that is consumed during each of said plurality of demand intervals;
determining the highest interval demand for each of said plurality of survey periods; and
determining a preselected number of the highest of a plurality of said highest interval demands, each of said plurality of said highest interval demands being the highest interval demand occurring during a different survey period, said preselected number being greater than one.

* * * * *